United States Patent

Kuo et al.

[11] Patent Number: 5,811,844
[45] Date of Patent: Sep. 22, 1998

[54] LOW NOISE, HIGH POWER PSEUDOMORPHIC HEMT

[75] Inventors: Jenn-Ming Kuo, Edison; Yu-Chi Wang, Piscataway, both of N.J.

[73] Assignee: Lucent Technologies Inc., Murray Hill, N.J.

[21] Appl. No.: 887,587

[22] Filed: Jul. 3, 1997

[51] Int. Cl.[6] .................................................. H01L 29/778
[52] U.S. Cl. .................................................................. 257/194
[58] Field of Search .................................. 257/192, 194, 257/24

[56] References Cited

PUBLICATIONS

Dickmann, et al., "(A10.7Ga0.3)0.5In0.5P/In0.15Ga0.85As/GaAs Heterostructure Field Effect Transistors with Very Thin Highly p–Doped Surface Layer," IEEE Trans. Electron Dev., vol. 42, No. 1, Jan., 1995, pp. 2–7.
Watanabe et al., *Journal of Applied Physics*, vol. 60, No. 3, pp. 1032–1037 (1986).
Watanabe et al., *Applied Physics Letters*, vol. 50, No. 14, pp. 906–908 (1987).
Bachem et al., *Inst. Phys. Conf.*, Ser. No. 136, Ch.2, pp. 35–40 (1993).
Kuo, *Thin Solid Films*, vol. 231, pp. 158–172 (1993).
Kuo, *Applied Physics Letters*, vol. 62, No. 10, pp. 1105–1107 (1993).
Takikawa et al., *IEEE Electron Device Letters*, vol. 14, No. 8, pp. 406–408 (1993).
Pereiaslavets et al., *IEEE Electron Device Letters*, vol. 43, No. 10, pp. 1659–1663 (1996).

*Primary Examiner*—Jerome Jackson
*Assistant Examiner*—John Guay
*Attorney, Agent, or Firm*—Michael J. Urbano

[57] ABSTRACT

In a DH-PHEMT the channel layer comprises InGaAs, the donor layers comprise $In_yGa_{1-y}P$ ($0.15 \leq y \leq 0.85$), and each of the spacer layers comprises an $In_{0.5-q}(Al_xGa_{1-x})_{0.5+q}P$ outer spacer layer ($0.2 \leq x$) and an $Al_rGa_{1-r}As$ ($0 \leq r \leq 0.3$) inner spacer layer. In another embodiment, a similar InAlGaP layer forms a Schottky barrier gate contact with a barrier height of at least 1.0 eV and hence low leakage current. The devices exhibit the capability for both low noise and high power operation at low supply voltages.

13 Claims, 2 Drawing Sheets

LOW NOISE, HIGH POWER PSEUDOMORPHIC HEMT

FIELD OF THE INVENTION

This invention relates generally to field effect transistors (FETs) and, more particularly, to a class of such transistors variously known as selectively-doped heterojunction transistors (SDHTs), high electron mobility transistors (HEMTs), and modulation-doped FETs (MODFETs).

BACKGROUND OF THE INVENTION

In some applications it is desirable to incorporate both low noise transistors and high power transistors into a single integrated circuit (IC). For example, monolithic microwave integrated circuits (MMICs) for wireless communication applications may incorporate both low noise HEMTs and high power HEMTs. However, low noise and high power are vastly different performance criteria which present conflicting design requirements to the IC design engineer.

To illustrate this conflict consider the decade-old AlGaAs/GaAs HEMTs in which AlGaAs is used as the barrier material. In these devices the Al mole fraction should be kept below about 23% to reduce the adverse effects of DX centers, which tend to deteriorate the low frequency noise figure of the device. With the Al mole fraction so limited the conduction band offset $\Delta E_c$ is likewise limited to about 0.19 eV. Yet, a higher $\Delta E_c$ is desirable because it provides a higher density two-dimensional electron gas (2DEG) and hence higher current drivability, which in turn enables higher power operation. To increase the conduction band offset the prior art has turned to pseudomorphic AlGaAs/InGaAs HEMTs, but their noise figures are still inferior to those of more recent device designs; e.g., the $In_{0.5}Ga_{0.5}P$/InGaAs HEMTs described by M. Takikawa et al., *IEEE Electron Device Letters*, Vol. 14, No.8, pp. 406–408 (1993). On the other hand, $In_{0.5}Ga_{0.5}P$/InGaAs HEMTs are inherently not well suited to high power operation because their 2DEG densities are limited by their relatively small $\Delta E_c$, which in turn limits their current drivability. The prior art has attempted to address this problem by incorporating relatively large amounts of Al into the InGaP donor supply layer, thereby increasing the conduction band offset (with respect to GaAs) above about 0.25 eV. (Hereinafter we shall refer to a donor supply layer by the shorter term donor layer.)

However, the presence of Al in the donor layer tends to increase the number of deep levels which introduce noise in the HEMT's operation. The presence of these deep levels can be detected by several techniques, such as persistent photoconductivity (PPC), which is a low temperature Hall-effect measurement of carrier concentration in the presence of light absorbed by the donor layer. This measurement is compared to a similar Hall-effect measurement made in the absence of such light. When the carrier concentrations measured in the dark and under illumination are the same (or nearly so), one can infer that there are few deep levels in the donor layer (compared to shallow levels there).

As a consequence, it is extremely difficult for single device design to be used as both a low noise HEMT and a high power HEMT for low voltage supply applications. Yet such a design would simplify device fabrication, reduce cost and increase yield.

Thus, a need remains in the art for single device design which can function as both a low noise HEMT and as a high power HEMT in the same IC.

SUMMARY OF THE INVENTION

In accordance with one aspect of our invention, a HEMT comprises an InGaAs channel layer, an $In_yGa_{1-y}P$ donor layer, and a pair of spacer layers disposed between the donor layer and the channel layer; i.e., an undoped $In_{0.5-q}(Al_xGa_{1-x})_{0.5+q}P$ outer spacer layer disposed adjacent the donor layer and an $Al_rGa_{1-r}As$ inner spacer layer disposed adjacent the channel layer. The quaternary spacer layer provides desirably large $\Delta E_c$ for high power operation, whereas the Al-free donor layer has relatively few deep levels as desired for low noise performance. In a preferred embodiment, the HBEMT employs two such donor/spacer layer pairs in a double heterojunction pseudomorphic HEMT configuration (DH-PHEMT).

BRIEF DESCRIPTION OF THE DRAWINGS

Our invention, together with its various features and advantages, can be readily understood from the following more detailed description taken in conjunction with the accompanying drawing, in which.

DETAILED DESCRIPTION OF THE INVENTION

Figure 1:
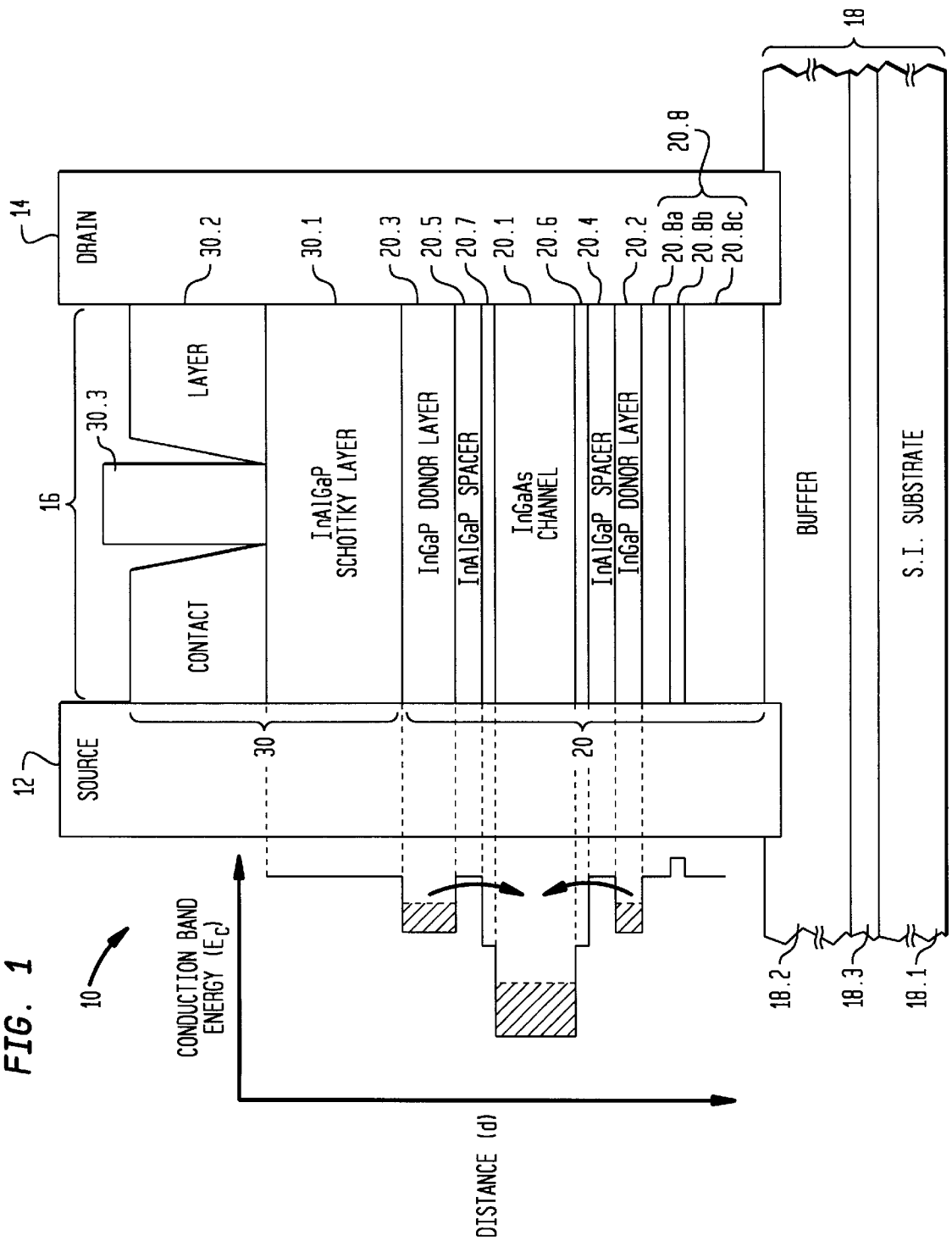
FIG. 1 is a partial block diagram, partial cross section of a DH-PHEMT in accordance with one embodiment of our invention; the semiconductor layers of the device comprise Group III–V compound materials; in the interests of simplicity this figure has not been drawn to scale; a schematic conduction band energy diagram is shown to the left of the channel structure 20.

With reference now to FIG. 1, a HEMT 10 according to an illustrative embodiment of our invention comprises a source 12 and a drain 14 both depicted as functional blocks disposed on a support member 18. Interconnecting the source and drain is a heterostructure 16 likewise disposed on support member 18. The latter typically comprises a GaAs semi-insulating substrate 18.1, an optional, defect-gettering superlattice 18.3 disposed on the substrate, and a buffer layer 18.2 disposed between the heterostructure 16 and the superlattice 18.3, as is well known in the art. The heterostructure 16 includes a pair of substructures: a channel structure 20 for supplying electrons to the channel layer 20.1, and a contact structure 30 for controlling the flow of electrons in the channel between the source 12 and drain 14.

The channel structure 20 is illustratively depicted as a double heterostructure, although the invention is not so limited; a single heterostructure can also be utilized depending on the particular output power and performance desired. The double heterostructure comprises two relatively wide bandgap, doped donor layers 20.2 and 20.3 disposed on either side of the narrower bandgap, undoped channel layer 20.1. The heterojunctions at the interfaces between these layers form a quantum well 21 in the channel layer. The term undoped layer as used throughout this description means that the layer is not intentionally doped, and in that sense typically has only a very low level of background doping. Such layers are designated i-layers (or equivalently i-type layers) even though they are not intrinsic in the ideal sense. The donor layers 20.2 and 20.3 are separated from the channel layer by pairs of i-type spacer layers 20.4,20.6 and 20.5,20.7, respectively. The spacer layers serve, in part, to reduce the coulomb scattering of electrons in the channel layer by donor ions in the donor layers. Inner spacer layers 20.6 and 20.7 are disposed adjacent the channel layer 20.1, whereas outer spacer layers 20.4 and 20.5 are disposed adjacent the donor layers 20.2 and 20.3, respectively. Typically, the inner spacer layers have a bandgap which is intermediate that of the channel layer and the outer spacer layers. In addition, the inner spacer layers 20.6 and 20.7 are phosphorus-free compositions (e.g., AlGaAs), which protect the channel layer (e.g., InGaAs) from the phosphorus-arsenic switching interface (i.e., the interfacial layer created when the Group V gas source is switched from arsenic to phosphorus, or vice-versa). Direct contact of this interfacial layer with the channel layer would produce roughness between the channel and inner spacers which, in turn, would cause undesirable electron scattering.

In embodiments utilizing a single heterostructure, one of the donor layers and its associated spacers (e.g., donor layer 20.2 and spacer layers 20.4 and 20.6) would be omitted. Finally, a pair of relatively wide bandgap i-layers 20.8 and 30.1 are also disposed adjacent the donor layers 20.2 and 20.3, respectively. The layer 20.8, which separates the donor layer 20.2 from the buffer layer 18.2, illustratively includes three relatively wide bandgap sub-layers: a p-type layer 20.8b sandwiched between a pair of i-type layers 20.8a and 20.8c. These three sub-layers reduce the leakage current to the buffer layer. In particular, the higher potential barrier induced by the buried p-type layer 20.8b effectively blocks the flow of electrons to the substrate side of the device.

In contrast, the wide bandgap layer 30.1 is part of the contact structure 30. More specifically, contact structure 30 comprises a relatively highly doped contact layer 30.2 which facilitates making ohmic contact to the source and drain, a gate electrode 30.3 disposed in an opening (or recess) formed in layer 30.2, and i-layer 30.1 which is disposed between electrode 30.3 and channel structure 20. In one embodiment, layer 30.1 forms a Schottky barrier at the interface with the electrode 30.3.

In operation, electrons from the donor layers tunnel through the spacer layers into the channel layer quantum well 21, as shown in the energy diagram of FIG. 1. In the on state of the HEMT, the relative voltages between the gate, source and drain are set so that electrons flow in the channel layer between the source and drain, whereas in its off state these voltages are set so that the channel layer is depleted and, therefore, electrons do not flow between the source and drain.

In accordance with one aspect of our invention, the channel layer 20.1 preferably comprises $In_zGa_{1-z}As$ (e.g., z=0.2), the Al-free donor layers 20.2,20.3 (or the single donor layer in the case of a single heterostructure) comprise $In_yGa_{1-y}P$ (e.g., $0.15 \leq y \leq 0.85$ approximately, with y=0.5 being the composition lattice-matched to GaAs), and the outer spacer layers 20.4,20.5 (or the single outer spacer layer in the case of a single heterostructure) comprise undoped $In_{0.5-q}(Al_xGa_{1-x})_{0.5+q}P$ with $x \geq 0.2$ approximately. Since the quaternary spacers are undoped, very few, if any, donor-related deep levels are generated in the outer spacer layers. The inner spacer layers (or the single inner spacer layer in the case of a single heterostructure) comprise undoped $Al_rGa_{1-r}As$ with $0 \leq r \leq 0.3$ approximately. Both donor layers need not have identical compositions. Likewise, the pair of outer spacer layers need not have identical compositions; similarly for the pair of inner spacer layers. On the other hand, the values of y,z and q are chosen to facilitate growth of the layers without generating dislocations. Typically q=0, in which case the AlGaAs/quaternary heterojunctions are lattice-matched, but in general $0 \leq q \leq 0.35$ is suitable, in which other cases that heterojunctions are pseudomorphic.

With this design our I–V measurements suggest that the heterojunctions between the donor layers and the outer spacer layers have sufficiently high conduction band discontinuity $\Delta E_c$ for high power operation (e.g., we measured an $I_{max}$ exceeding 580 mA/mm). Moreover, our PPC measurements of carrier concentration in bulk material indicated an insignificant number of deep levels in the Al-free, Si-doped InGaP layers, which makes our HEMTs especially suitable for low noise applications. Similar measurements on our HEMTs also demonstrated no significant PPC effect.

In addition, the leakage current of our HEMTs, such as the one depicted in FIG. 1, is reduced by also making the Schottky layer 30.1 of $In_{0.5-q}(Al_xGa_{1-x})_{0.5+q}P$ with an Al composition of $0.2 \leq x$ approximately. As a result, Schottky barrier heights as high as 1.0 eV at x=0.3 can be achieved.

EXAMPLE

This example describes a DH-PHEMT in accordance with the various aspects of our invention described above. The device was fabricated using gas-source molecular beam epitaxy (GSMBE) and optical lithography techniques of the type described by one of us, J-M. Kuo in *Thin Solid Films*, Vol. 231, pp. 158–172 (1993), which is incorporated herein by reference. Si was used as the n-type dopant for the donor layers and the contact layer. Be was used as the p-type dopant for layer 20.8b. The various parameters, dimensions, materials, operating conditions, etc. are provided by way of illustration only, and are not intended to be limitations on the scope of the invention unless expressly so stated.

From a structural standpoint the device was formed on a 5000 A (Angstrom) thick i-type GaAs buffer layer 18.2 grown on superlattice 18.3. The superlattice comprised ten pairs of $Al_{0.2}Ga_{0.8}As/GaAs$ layers, each layer being 100 A thick. Substrate 18.1 was semi-insulating GaAs. The channel layer 20.1 comprised a 130 A thick $In_{0.2}Ga_{0.8}As$ i-layer. The inner spacer layers 20.6 and 20.7 both were 20 A thick $Al_{0.2}Ga_{0.8}As$ i-layers, and the outer spacer layers 20.4 and 20.5 were both 30 A thick InAlGaP i-layers. The donor layers 20.2 and 20.3 were, respectively, 20 A and 50 A thick $In_{0.5}Ga_{0.5}P$ n-type layers. The Schottky layer 30.1 was a 250 A thick InAlGaP i-layer. The lower layer 20.8 comprised a 25 A thick p-type InAlGaP layer 20.8b sandwiched between a 50 A thick i-type InAlGaP layer 20.8a and 500 A thick i-type InAlGaP layer 20.8c. All InAlGaP layers of this device had the composition $In_{0.5}(Al_{0.2}Ga_{0.8})_{0.5}P$. The contact layer 30.2 was a 500 A thick n⁺-type GaAs layer. Lastly, the gate electrode 30.3 was a 3700 A thick layer of Ti/Pt/Au, and the source and drain electrodes (not shown) were both 2000 A thick composite layers of Ge/Ni/AuGe/Ag/Au.

Making the Schottky layer 30.1 of this particular quaternary composition provided advantages beyond increased Schottky barrier height; namely, better control of gate recess dimensions, voltage threshold and yield, all resulting, at least in part, from the ability to exploit the etching selectivity between binary contact layer 30.2 and quaternary Schottky layer 30.1 when forming the opening in the contact layer for the electrode 30.3.

Figure 2:
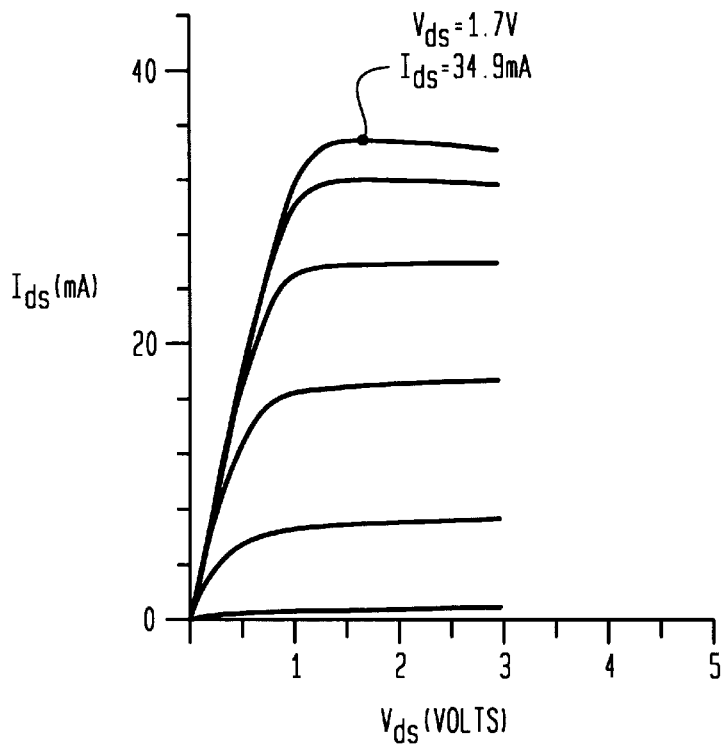
FIG. 2 is an I–V characteristic of a device according to FIG. 1 having a gate length of 1 $\mu$m and a gate width of 60 $\mu$m.
Figure 3:
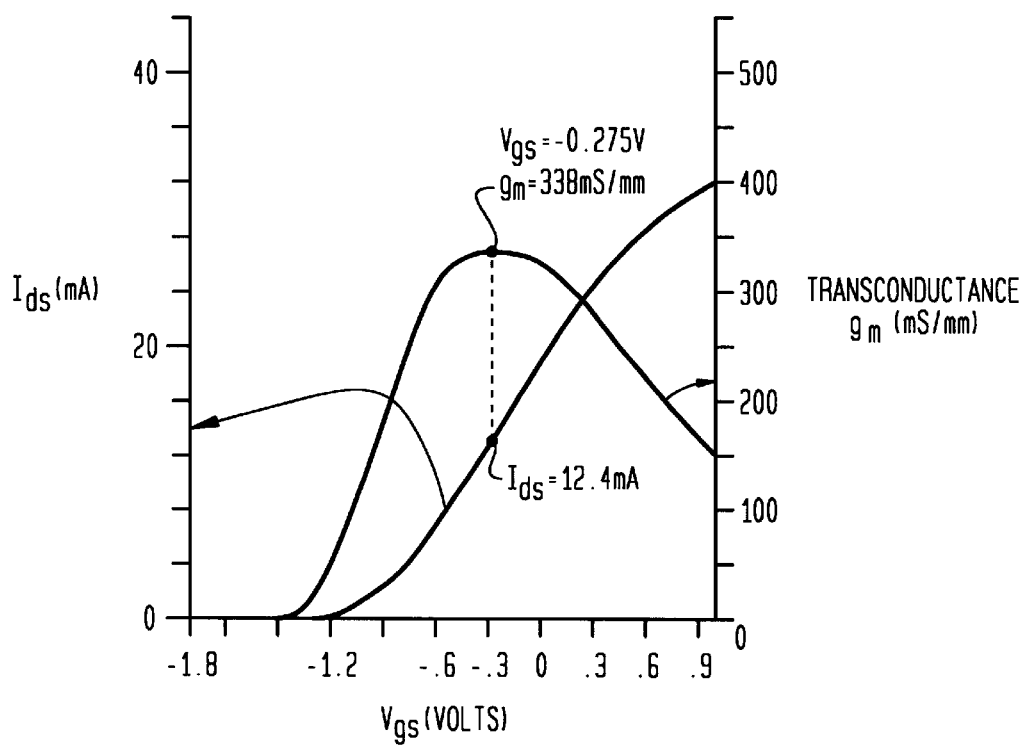
FIG. 3 is a graph of drain-source current and transconductance versus gate-source voltage of a device according to FIG. 1 having a gate length of 1 $\mu$m and a gate width of 60 $\mu$m.

We performed a number of tests and measurements which demonstrated that our invention has significant potential for low supply voltage (e.g., <3 V), low noise, high power applications. For example, we measured the I–V characteristics shown in FIG. 2. The device, which had gate length x width of 1 μm×60 μm, exhibited an $I_{max}$ exceeding 580 mA/mm. The same device had a peak transconductance $g_m$ of nearly 340 mS/mm (FIG. 3). These parameters indicate the suitability of our HEMTs for high power applications.

On the other hand, low noise performance was suggested by PPC measurements; i.e., Hall-effect measurements were not sensitive to absorptive light illumination, which indicates a very low number of deep levels in the donor layers (relative to the number of shallow levels).

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the donors in the donor layers may be distributed essentially uniformly across the layer thickness (as in MODFETs), or may be concentrated in a narrow band or region (known in the art as δ-doping).

What is claimed is:

1. A transistor comprising a source and a drain, a heterostructure including a narrow bandgap channel layer coupling said source to said drain and in which a quantum well is formed to confine electrons, a first wider bandgap donor layer for supplying said electrons to said quantum well, and a first spacer layer disposed between said donor and channel layer, and a gate contact structure for applying voltage to said heterostructure to control the flow of electrons in said channel between said source and said drain, characterized in that said channel layer comprises InGaAs, said first donor layer comprises $In_yGa_{1-y}P$ and said first spacer layer comprises a first outer spacer layer adjacent said donor layer and a first inner spacer layer adjacent said channel layer, said outer spacer layer comprising undoped $In_{0.5-q}(Al_xGa_{1-x})_{0.5+q}P$, and said inner spacer layer comprising undoped $Al_rGa_{1-r}As$, said channel layer and said inner spacer layer forming a pseudomorphic heterojunction at the interface between them.

2. The invention of claim 1 wherein $0.2 \leq x$, $0.15 \leq y \leq 0.85, 0 \leq r \leq 0.3$, and $0 \leq q \leq 0.35$, approximately.

3. The invention of claim 1 wherein said heterostructure includes a second wider bandgap donor layer for supplying said electrons to said quantum well, and a second spacer layer disposed between said channel layer and said second donor layer, said first and second donor layers being disposed on opposite sides of said channel layer, and further characterized in that said second spacer layer also comprises a second outer spacer layer adjacent said second donor layer and a second inner spacer layer adjacent said channel layer, said second outer spacer layer comprising undoped $In_{0.5-q}(Al_xGa_{1-x})_{0.5+q}P$, said second inner spacer layer comprising in $Al_rGa_{1-r}As$, and said second donor layer also comprising $In_yGa_{1-y}P$.

4. The invention of claim 3 wherein $0.2 \leq x$, $0.15 \leq y \leq 0.85$, $0 \leq r \leq 0.3$, and $0 \leq q \leq 0.35$, approximately.

5. The invention of claim 1 wherein said gate contact structure includes a gate electrode and a third wide bandgap layer forming a Schottky barrier with said electrode, further characterized in that said third layer also comprises $In_{0.5-q}(Al_xGa_{1-x})_{0.5+q}P$ in which $0.2 \leq x$ and $0 \leq q \leq 0.35$ approximately.

6. The invention of claim 5 wherein the composition of said third layer produces a Schottky barrier height of about 1.0 eV.

7. The invention of claim 3 wherein said channel layer comprises an $In_{0.2}Ga_{0.8}As$ i-type layer and each of said donor layers comprises an $In_{0.5}Ga_{0.5}P$ n-type layer.

8. A high electron mobility transistor comprising a source and a drain, a heterostructure comprising an i-type $In_{0.2}Ga_{0.8}As$ channel layer coupling said source to said drain and in which a quantum well is formed for confining electrons, a pair of $In_yGa_{1-y}P$ ($0.15 < y < 0.85$) Si-doped, n-type donor layers disposed on opposite sides of said channel layer for supplying said electrons to said quantum well, a pair of $In_{0.5-q}(Al_xGa_{1-x})_{0.5+q}P$ ($0 \leq q \leq 0.35$ and $0.2 \leq x$ approximately) i-type outer spacer layers, an outer spacer layer disposed between said channel layer and each of said donor layers, and a pair of $Al_rGa_{1-r}As$ ($0 \leq r \leq 0.3$) i-type inner spacer layers, an inner spacer layer disposed between each of said outer spacer layers and said channel layer, and a gate contact structure for applying voltage to said heterostructure including a Si-doped, n-type GaAs contact layer having and opening therein, a gate electrode disposed in said opening, and an i-type $In_{0.5-q}(Al_xGa_{1-x})_{0.5+q}P$ layer forming a Schottky barrier with said gate electrode, wherein $0.2 \leq x$ and $0 \leq q \leq 0.35$ approximately.

9. The invention of claim 8 wherein the mole fraction of Al in said i-type layer produces a Schottky barrier height of at least about 1.0 eV.

10. The invention of claim 8 wherein said outer spacer layers comprise $In_{0.5-q}(Al_{0.2}Ga_{0.8})_{0.5+q}P$.

11. The invention of claim 10 wherein q=0.

12. An integrated circuit comprising a high power transistor, and a low noise transistor, each of said transistors comprising a source and a drain, a heterostructure including a narrow bandgap channel layer coupling said source to said drain and in which a quantum well is formed to confine electrons, a first wider bandgap donor layer for supplying said electrons to said quantum well, and a first spacer layer disposed between said donor and channel layers, and a gate contact structure for applying voltage to said heterostructure to control the flow of electrons in said channel between said source and said drain, characterized in that said channel layer comprises InGaAs, said first donor layer comprises $In_yGa_{1-y}P$ and said first spacer layer comprises a first outer spacer layer adjacent said donor layer and a first inner spacer layer adjacent said channel layer, said outer spacer layer comprising undoped $In_{0.5-q}(Al_xGa_{1-x})_{0.5+q}P$, and said inner spacer layer comprising undoped $Al_rGa_{1-r}As$, said channel layer and said inner spacer layer forming a pseudomorphic heterojunction at the interface between them.

13. The invention of claim 12 wherein $0.2 \leq x$, $0.15 \leq y \leq 0.85$, $0 \leq r \leq 0.3$, and $0 \leq q \leq 0.35$, approximately.

* * * * *